US009368378B2

(12) United States Patent
Wen

(10) Patent No.: US 9,368,378 B2
(45) Date of Patent: Jun. 14, 2016

(54) SEMICONDUCTOR WAFER CLEANING SYSTEM

(71) Applicant: Sophia Wen, Wuxi (CN)

(72) Inventor: Sophia Wen, Wuxi (CN)

(*) Notice: Subject to any disclaimer, the term of this patent is extended or adjusted under 35 U.S.C. 154(b) by 240 days.

(21) Appl. No.: 14/145,882

(22) Filed: Dec. 31, 2013

(65) Prior Publication Data
US 2015/0187609 A1 Jul. 2, 2015

(51) Int. Cl.
H01L 21/67 (2006.01)
(52) U.S. Cl.
CPC .................. H01L 21/6719 (2013.01)
(58) Field of Classification Search
None
See application file for complete search history.

(56) References Cited

U.S. PATENT DOCUMENTS

2002/0124906 A1* 9/2002 Suzuki .............. H01L 21/67017
141/98
2011/0140334 A1* 6/2011 Zuniga ................ H01L 21/6719
269/289 R

FOREIGN PATENT DOCUMENTS

WO    WO2004114375    * 12/2004 ............. H01L 21/00

* cited by examiner

Primary Examiner — Michael Barr
Assistant Examiner — Cristi Tate-Sims
(74) Attorney, Agent, or Firm — Han IP Corporation; Andy M. Han

(57) ABSTRACT

A semiconductor wafer cleaning apparatus comprising a first supporting unit, a movable unit having a first chamber, a second supporting unit having a second chamber, and a third supporting unit is provided. A micro processing chamber in which the semiconductor wafer is being processed is formed when the first chamber is brought in contact with the second chamber. Each of the supporting units is supported by a corresponding supporting plate, and each supporting plate is positioned and strengthened by a plurality of supporting bars on its peripheral. Such design will prevent the deformation of the supporting plates, reduce the particles generated by the friction of parts resulted from the opening or closure of the micro processing chamber, and allow the easy alignment of these units.

20 Claims, 4 Drawing Sheets

SEMICONDUCTOR WAFER CLEANING SYSTEM

TECHNICAL FIELD

The present disclosure relates to chemical processing fine surfaces. More particularly, the present disclosure relates to an apparatus for cleaning semiconductor wafers.

BACKGROUND

Semiconductor wafers are widely used as substrates for integrated circuits (ICs). Cleaning of wafers must take place after most processing steps and before each high-temperature operation, making it the most frequently repeated step in IC manufacturing. Existing methods for ultra-clean wafer surface preparation fall into two broad categories: wet cleaning processes such as immersion and spray techniques, and dry cleaning processes such as chemical vapor and plasma based techniques. Wet cleaning techniques have been successfully used for the past thirty years and are still favored because many inherent properties of liquid solutions facilitate the removal of metals and particles. The wet cleaning processing typically consists of a series of steps of immersing or spraying the wafers with appropriate chemical solutions.

As critical dimensions decrease and the wafer size increases, there are always needs for new techniques and chemistry for cleaning and drying. Currently, the investigation has been driven by a multitude of processes, including new materials/substrates for high mobility channels, epitaxial SiGe for raised source/drains, new materials for capacitors, removal of high dose implanted resist, removal of small particles without adverse impact on structures, use of ceria-based slurries for chemical-mechanical polishing (CMP), needs for etching, cleaning and drying contacts and other structures with increasing aspect ratios, and the efforts in chemical and water usage reduction for ESH and COO benefits.

A particular apparatus used for wet cleaning semiconductor wafers is disclosed in U.S. Pat. No. 7,938,906, issued on May 10, 2011 to the inventor of the present application. The teaching of U.S. Pat. No. 7,938,906 is incorporated herein by reference.

U.S. Pat. No. 7,938,906 discloses an apparatus having a micro processing chamber in which a semiconductor wafer is closely received and processed. The micro processing chamber composed of an upper chamber and a lower chamber can be either situated in the open position to load or remove the semiconductor wafer or in the closed position to introduce chemical reagents or other fluids into the chamber for the processing of the semiconductor wafer. The above-mentioned open or closed position can be accomplished by the relative movement of the upper and lower movable parts.

In U.S. Pat. No. 7,938,906, the upper and lower movable parts of the apparatus are held together by four posts extending upwardly from each corner portion of the bottom plate of the lower movable part to the top plate of the upper movable part, along which the movable parts can be raised or lowered to set the micro processing chamber in the open or closed position. However, there are several problems associated with this design, thus the apparatus disclosed in U.S. Pat. No. 7,938,906 is not suitable for certain applications. First, the posts limit the three-dimensional movement of the micro processing chamber that is needed for certain applications. Second, when the chamber dimension is getting bigger, the plates that hold the upper chamber and lower chamber together can easily be deformed. The deformation will affect the shape and dimension of the internal space of the chamber formed after the upper chamber and lower chamber closed, resulting in unexpected processing results. Third, the prior art design requires accurate machining of the posts and corresponding holes in the plates and boxes in order to achieve a good alignment of all the parts. Finally, during the operation, the movable parts moving along the posts may produce particles caused by friction. The particles maybe the contamination source of the processing. In advanced semiconductor fabrication, it has been widely recognized that most particle contaminations come from the processing system. Therefore, there remains a need to optimize the apparatus design to simply the manufacture of components and to reduce contaminations resulting from the movement of the components of apparatus.

SUMMARY

The present disclosure provides a semiconductor wafer cleaning apparatus.

In one aspect, a semiconductor wafer cleaning apparatus may comprise: a first supporting unit, a movable unit being supported by the first supporting unit, a second supporting unit opposite to the first supporting unit, a third supporting unit, and a plurality of spacing posts. The first supporting unit may comprise: a first supporting plate; and a plurality of first supporting bars, each of the plurality of the first supporting bars having a first groove depressed on an inner face of the first supporting bar in a longitudinal direction for positioning and strengthening the first supporting plate along a peripheral portion of the first supporting plate. The movable unit may comprise: a driving unit disposed on the first supporting plate; a second supporting plate disposed on a top of the driving unit; and a first chamber disposed on the second supporting plate. The second supporting unit may comprise: a second chamber; a third supporting plate having a first through opening for positioning the second chamber; and a plurality of second supporting bars, each of the plurality of the second supporting bars having a second groove depressed on an inner face of the second supporting bar in a longitudinal direction for positioning and strengthening the third supporting plate along a peripheral portion of the third supporting plate. The third supporting unit may comprise a fourth supporting plate having a plurality of screws or movable parts that apply pressure to the second chamber. Each of the plurality of the third supporting bars may include a third groove depressed on an inner face of the third supporting bar in a longitudinal direction for positioning and strengthening the fourth supporting plate along a peripheral portion of the fourth supporting plate. The plurality of spacing posts may be disposed between the first supporting bars for positioning the first supporting plate and the second supporting bars for positioning the third supporting plate, each of the spacing posts connecting a corresponding first supporting bar and a corresponding second and third supporting bar. The first chamber and the second chamber may be configured such that when the first chamber is brought into contact with the second chamber, a micro processing chamber in which the semiconductor wafer is being processed is formed.

In one embodiment, each of the first supporting bars may be connected to a first end of a corresponding spacing post by welding or a first connecting means. Each of the second supporting bars may be connected to a second end of the corresponding spacing post opposite to the first end by welding or a second connecting means. Each of the third supporting bars may be connected to a corresponding second supporting bar by welding or a third connecting means.

In one embodiment, the first, the second, and the third connecting means may include rods or screws.

In one embodiment, the first supporting unit may further comprise a first safety ring disposed on the first supporting plate. The movable unit may further comprise a second safety ring disposed on the second supporting plate. The second safety ring may be in contact with the first safety ring to form a cavity within which the driving unit is disposed.

In one embodiment, the driving unit may comprise one or more air bags, a mechanical positioner, or a pneumatic positioner.

In one embodiment, the first supporting plate may comprise one more openings for receiving the driving unit or other parts In one embodiment, the other parts may comprise a vacuum pump.

In one embodiment, the movable unit may further comprise a first box disposed on the second supporting plate within which the first chamber is disposed.

In one embodiment, the first box may include an inclined bottom surface. The inclined bottom surface may be configured to direct leaked fluids flowing to the lowest end of the first box.

In one embodiment, the semiconductor wafer cleaning apparatus may further comprise a leakage detector sensor disposed at a lowest end of the first box.

In one embodiment, the first box may comprise a drainage opening through which fluids leaked from the micro processing chamber are drained from the first box.

In one embodiment, the second supporting unit may further comprise a second box having a second through opening disposed on the third supporting plate. The second through opening may be aligned with the first through opening such that the second chamber is disposed within the third supporting plate through the first and the second through openings.

In one embodiment, each of the spacing posts may further comprise a track for guiding the movement of the movable unit.

In one embodiment, the movable unit may further comprise a guiding means for guiding the movement of the movable unit.

In one embodiment, the guiding means may include a plurality of wheels. Each of the plurality of wheels may be installed at a corner or edge of the second supporting plate or at a corner or edge of the first box.

In one embodiment, each of the first supporting bars may further comprise a fourth groove depressed on an end face of the first supporting bar. The fourth grooves may be configured such that a peripheral portion of a tool cover can be inserted and fixed into the fourth grooves.

In one embodiment, the first chamber or second chamber may comprises one or more exhaust openings through which fluids are exhausted from the micro processing chamber.

In one embodiment, the first chamber or second chamber may comprise one or more inlet openings through which fluids are introduced into the micro processing chamber.

In one embodiment, the third supporting unit may further comprise one or more pressure even plates for evening point pressures produced by the screws or movable parts on the fourth supporting plate.

In one embodiment, the first supporting bars, the second supporting bars, and the third supporting bars may be made of stainless steel or high strength aluminum alloy.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF PREFERRED EMBODIMENTS

Figure 1:
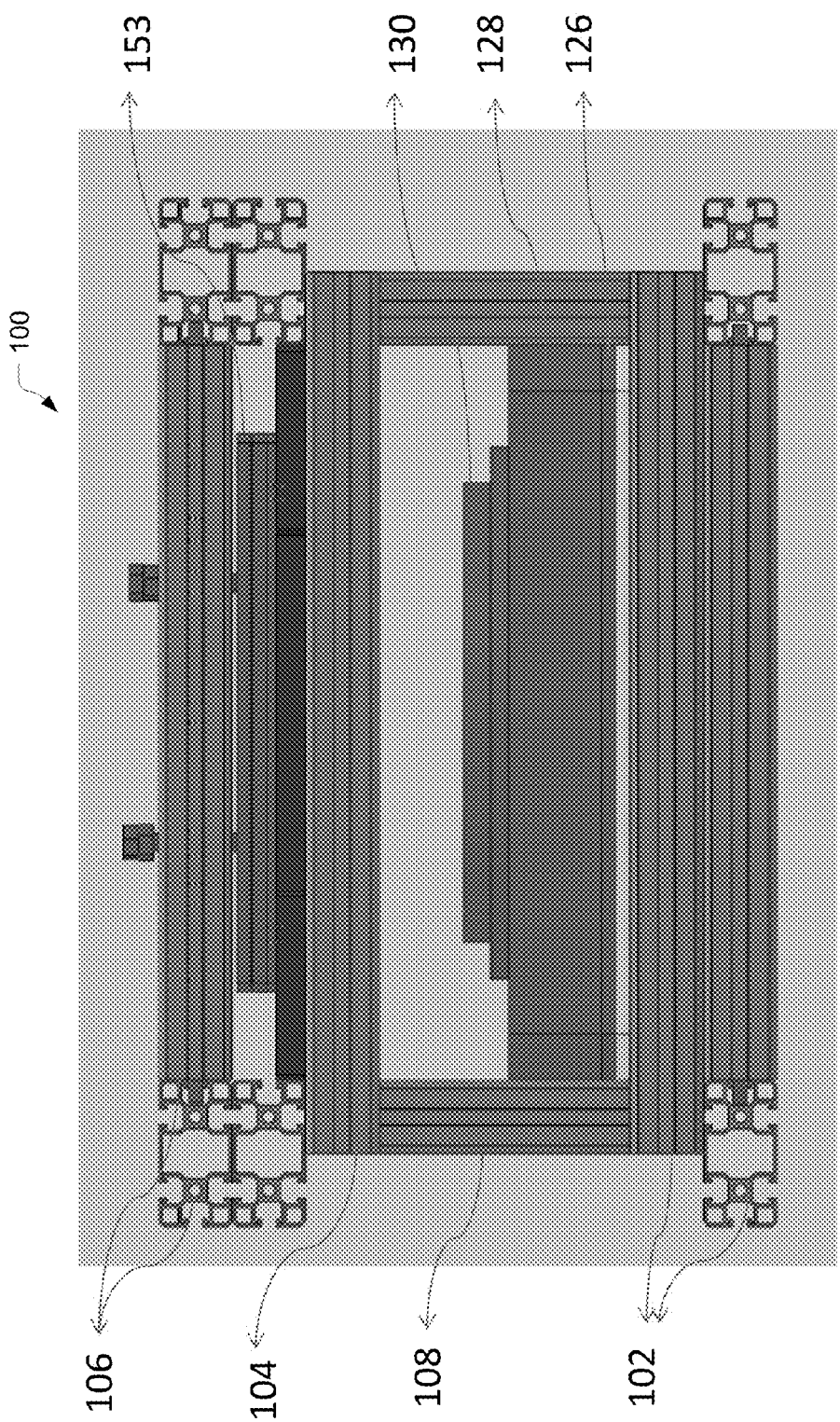
FIG. 1 is a side view of a semiconductor wafer cleaning apparatus with an example embodiment of the present disclosure.
Figure 2:
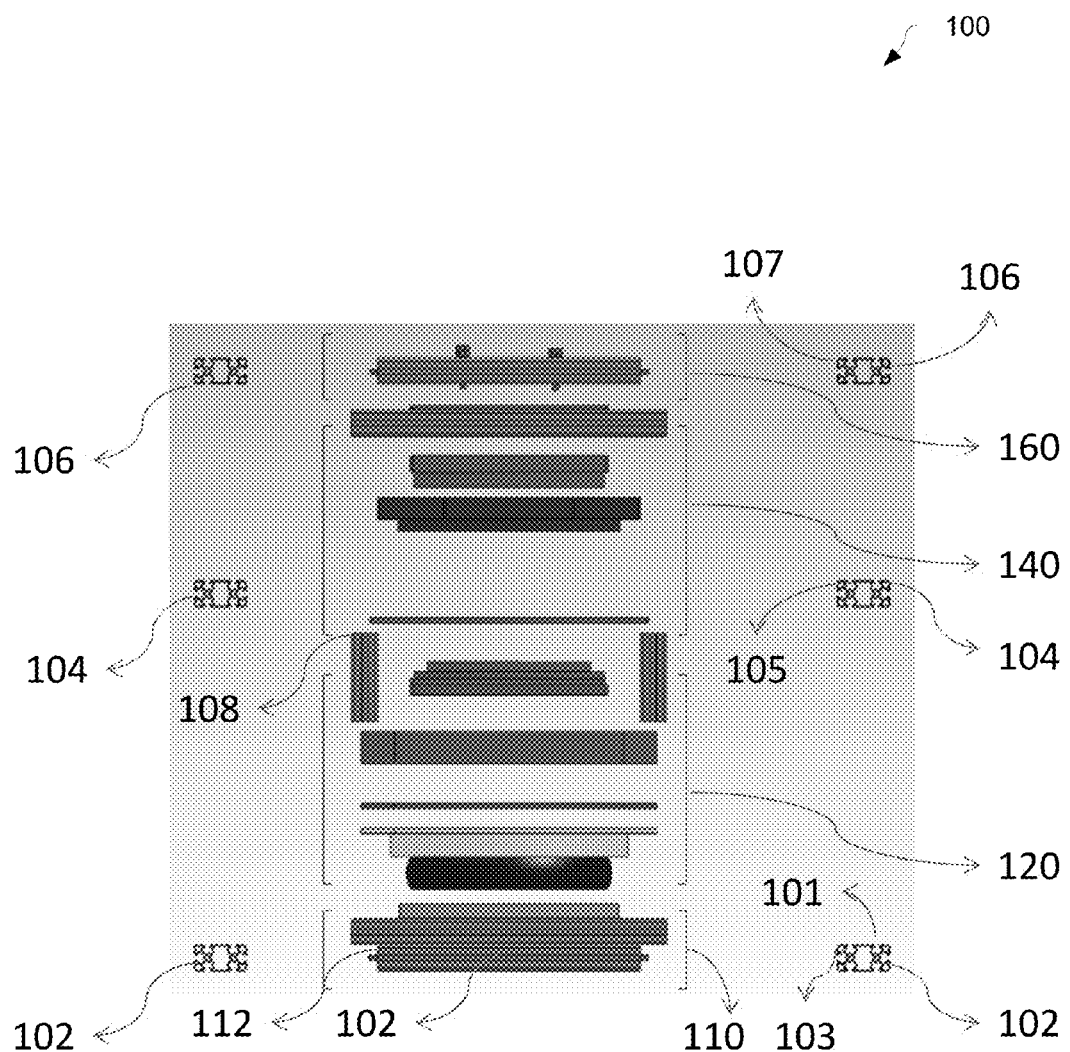
FIG. 2 is a disassembled side view of the semiconductor wafer cleaning apparatus of FIG. 1.

A semiconductor wafer cleaning apparatus 100 of the present disclosure is shown schematically in FIGS. 1-4. A side view of the semiconductor wafer cleaning apparatus is shown in FIG. 1. A disassembled side view of the apparatus 100 is shown in FIG. 2. Referring to FIGS. 1 and 2, briefly, the apparatus 100 may comprise a bottom supporting unit 110, a movable unit 120, an upper chamber supporting unit 140, and a top supporting unit 160. The bottom supporting unit 110 is configured to support the movable unit 120 and to form a complete closed/open space between the first chamber supported by the movable unit 120 and the second chamber supported by the upper chamber supporting unit 140 for wet cleaning structure with the top supporting unit 160, within which all parts are contained.

Figure 3:
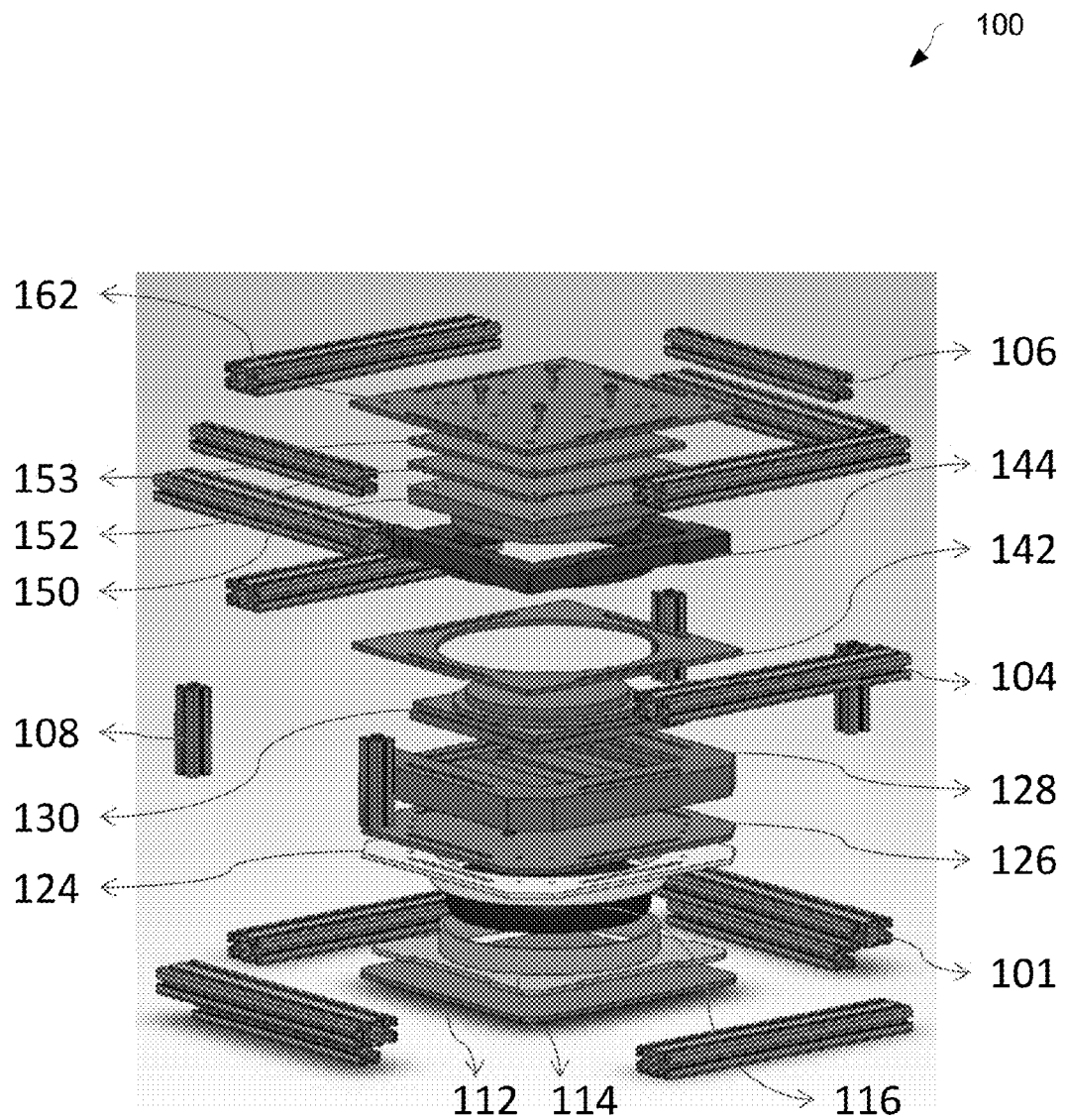
FIG. 3 is a disassembled perspective corner view of the semiconductor wafer cleaning apparatus of FIG. 1.
Figure 4:
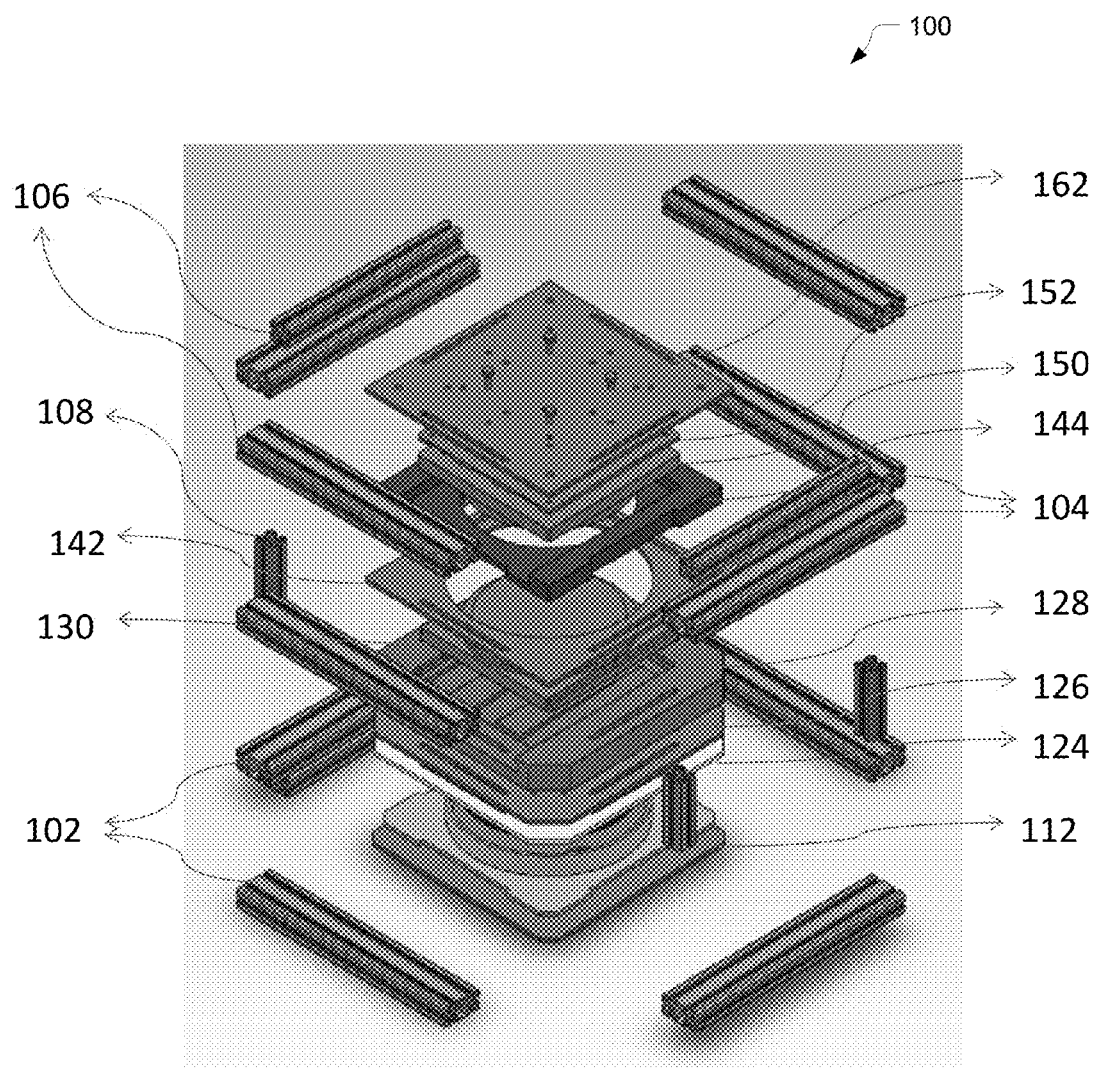
FIG. 4 is a disassembled perspective top view of the semiconductor wafer cleaning apparatus of FIG. 1.

A disassembled perspective corner view and a disassembled perspective top view of the apparatus 100 are shown in FIGS. 3 and 4, respectively. Referring to FIGS. 3 and 4, the bottom supporting unit 110 includes, at least, a bottom supporting plate 112, a lower safety ring 114, and four lower supporting bars 102. The bottom supporting plate 112 should be made of materials with high strength such as stainless steels or high strength aluminum alloys because it will encounter pressure that is required to keep the chamber closed. The bottom supporting plate 112 also consists of openings for positioning an air bag 116 and other parts, such as vacuum pumps, on the bottom supporting plate 112. The edges of the bottom supporting plate 112 that stand the most pressure during the cleaning process are strengthened by four lower supporting bars 102. Each of the lower supporting bars 102 includes a groove 103 depressed on the inner side of the supporting bar 102 in a longitudinal direction. The bottom supporting plate 112 can be slid into the grooves 103. The thicknesses of the edges of the bottom supporting plate 112 are configured to fit into the grooves 103, thus the bottom supporting plate 112 is positioned and confined by the lower supporting bars 102. Each of the lower supporting bars 102 also includes a groove 101 depressed on the end of the supporting bar 102. A tool cover (not shown) can be slid into the grooves 101 and be contained and fixed within the grooves 101. The lower safety ring 114 is configured to cover the air bag 116 for safety and cleanness purposes.

The movable unit 120 includes an upper safety ring 124, a lower supporting plate 126, a lower box 128, and a lower chamber 130. The lower chamber 130 defines a lower working surface and a lower interior perimeter of the micro processing chamber. An air bag 116 disposed on top of the bottom supporting plate 112 or other kinds of commercially available techniques, for example, a mechanical positioner or a pneumatic positioner, can be used to move the movable unit 120 up and down. When more than one air bag is used, other kinds of movement can also be realized. For example, when four air bags are used, through the systematical control of air bags, each air bag can be computerized to inflate or deflate independently such that the joint motion of four air bags results in all kind of movements, for example, a waving movement. The movements of the movable unit 120 can be guided by wheels installed on the corners or edges of the lower supporting plate 126 or on the corners or edges of the lower box 128 or guided along tracks depressed on the spacing posts 108 disposed between the first supporting bars 102 and the second supporting bars 104 for positioning the first supporting plate 112 and the third supporting plate 142. Other existing techniques can also be employed to assist the movement of the movable unit 120. The upper safety ring 124 together with the lower safety ring 114 covers the air bag 116 for safety and cleanness purposes. The material used for making the lower box 128 will depend on fluids used during the cleaning process. The lower box 128 is disposed on top of the lower supporting plate 126 and is configured to position the lower chamber 130 and to collect fluids leaked from the lower chamber 130. The lower box 128 can be machined into any shape as long as it fulfills the above mentioned functions. The lower box 128 has an inclined bottom surface. When fluids are leaked from both the lower chamber 130 and upper chamber 150, the leaked fluids will be collected at the lower portion of the lower box 128 and trigger a leakage detection sensor located in the lowest portion of the lower box 128, thus the tool alarm will be triggered and the delivery of fluids will be stopped. The lower box 128 also contains a drainage opening to exhaust the leaked fluids from the lower box 128, thus preventing overflow of the fluids in the situation when the leakage detection sensor is failed. The material used to make the lower chamber 130 will depend on the fluids used during the cleaning process. In general, the selected material should have a good chemical resistance to the fluids employed. The structure of the lower chamber 130 will be designed according to the purpose of the cleaning process. Generally, the lower chamber 130 needs fulfill high safety, high efficiency and low cost requirements. The structure of the lower chamber 130 is not covered in the present disclosure.

The upper chamber supporting unit 140 includes an upper supporting plate 142, an upper box 144, an upper chamber 150 and four upper supporting bars 104. The upper chamber 150 defines an upper working surface and an upper interior perimeter of the micro processing chamber. The upper supporting plate 142 includes a through opening and configured to support the upper box 144 and the upper chamber 150. Preferably, the upper supporting plate 142 is made of materials with high strength such as stainless steels or high strength aluminum alloys. The thickness of the edges of the upper supporting plate 126 are configured such that the edges of the upper supporting plate can be slid into grooves 105 depressed on the inner side of the upper supporting bars 104 in a longitudinal direction, thereby contained and fixed within the grooves 105 of the upper supporting bars 104. The materials used to make the upper box 144 will be determined by the fluids used during the cleaning process. The upper box 144 is configured to position the upper chamber 150 and to guide the leaked fluids flowing through the inner ring of the upper box 144, thus preventing leaked fluids from overflowing to other areas of the apparatus. The upper box 144 precisely positions the upper chamber 150 so that when the chamber is closed, the upper chamber 150 will mate perfectly with the lower chamber 130.

The top supporting unit 160 includes a top supporting plate 162 and four top supporting bars 106 and pressure even plates 152 and 153. The top supporting plate 162 consists of openings for the passing through of wires and tubing. The top supporting plates 162 is positioned by the top supporting bars 106. Each of the top supporting bars 106 includes a groove 107 depressed on the inner side of the supporting bar 106 in a longitudinal direction. The thicknesses of edges of the top supporting plate 162 are configured such that the edges of the top supporting plate 162 can be slid into the grooves 107 and be contained and fixed within the grooves 107. The top supporting plate 162 also includes screws or other existing movable parts, for example, pneumatic components. Forces can be applied to the upper chamber 150 through these screws or existing movable parts to adjust the level position and interior shape of the micro processing chamber. The pressure even plates 152 and 153 are used to even point pressures produced from the screws and other existing movable parts to the large area.

All the supporting bars 102, 104, 106 and the spacing posts 108 are connected together through connecting parts or welding techniques. In one embodiment, the supporting bars 102, 104, 106 and the spacing posts 108 are connected together by a plurality of rods having a screw on at least one end of the rod. The screw goes through each of the first supporting bars 102, each of the second supporting bars 104, each of the third supporting bars 106, and the center of each of the spacing posts 108. All the supporting bars 102, 104, 106 and spacing posts 108 are connected together by fastening the nut at the end of the rods. In one embodiment, each of the first supporting bars 102 is connected to one end of a corresponding spacing post 108 by a plurality of screws driving through the first supporting bar into an opening disposed at the center of the spacing post 108 which is pre-screw tracked. Each of the second supporting bars 104 and a corresponding third supporting bar 106 are connected to the opposite end of the corresponding spacing post 108 by a plurality of screws driving through the second and third supporting bars 104, 106 into an opening disposed at the center of the spacing post that are pre-screw tracked. In one embodiment, each of the first supporting bars 102 is connected to one end of a corresponding spacing post 108 by welding, each of the second supporting bars 104 is connected to the opposite end of a corresponding spacing post 108 by welding, and each the second supporting bars 104 is connected to a corresponding third supporting bar by welding 106. The spacing posts 108 are for the need of stronger strength.

Hereinafter, a semiconductor wafer cleaning method using the semiconductor wafer cleaning apparatus in accordance with the present disclosure is described.

First, a semiconductor wafer is loaded on top of the lower chamber 130.

Next, the lower and the upper chambers 130, 150 are set to be in closed position by pressing the air into the air bag 116. When the air bag 116 is inflated, the air bag 116 pushes the lower supporting plate 126, the lower box 128 and the lower chamber 130 moving upwardly until the lower chamber 130 is in contact with the upper chamber 150 that is positioned by the upper supporting plate 142 and the upper box 144.

After the micro processing chamber is closed, the cleaning process starts by introducing desired processing fluids into the micro processing chamber by a fluid distribution system (not shown) comprising at least one opening located in either the lower or the upper chamber. The used fluids will be drained out of the micro processing chamber through at least one opening located in the lower or the upper chamber.

Then, after the cleaning process is completed, the air in the air bag 116 is released. When the air bag 116 deflates, the lower supporting plate 126, the lower box 128 and the lower chamber 130 will be moved downward till the upper safety ring 124 reaches the lower safety ring 114 supported by the bottom support plate 112.

Finally, the semiconductor wafer is removed from the lower chamber 130.

The apparatus design in the present disclosure has several advantages. First, there are no four posts going through plates and boxes of the main structure of apparatus. All the edges of supporting plates are strengthened by supporting bars whose size could be adjusted according to the applications. The supporting bars are more effective in preventing the supporting plates from being deformed by the pressure or vacuum force that is required during the cleaning process and needed to keep the upper and lower chambers precisely attached to each other. In addition, the introduction of supporting bars would reduce the possibility of particles generation by the friction of parts resulted from the opening or closure of the micro processing chamber. Second, the interior shape of the micro processing chamber can be easily tuned by adjusting screws or other existing moving parts in the top supporting unit. Third, the improved design makes it possible to recycle more parts when the wafer cleaning apparatus is at the end of its life.

The improved design disclosed herein would allow a wider utilization of techniques into the tool design for better chamber alignments and provide more choices for chamber positioning and movement, such as precisely closing the chamber, accurately leveling or tilting the chamber, and conducting more complicated movements like wave movement. Therefore, the apparatus design disclosed in the present disclosure can greatly simplify the manufacture of most parts, and allow the ease maintenance and replacement of most parts. All of which can significantly lower the manufacturing cost.

Although select embodiments are described above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. A semiconductor wafer cleaning apparatus, comprising:
    a first supporting unit, the first supporting unit comprising:
        a first supporting plate; and
        a plurality of first supporting bars, each of the plurality of the first supporting bars having a first groove depressed on an inner face of the first supporting bar in a longitudinal direction of the first supporting bar for positioning and strengthening the first supporting plate along a peripheral portion of the first supporting plate;
    a movable unit being supported by the first supporting unit, the movable unit comprising:
        a driving unit disposed on the first supporting plate;
        a second supporting plate disposed on a top of the driving unit; and
        a first chamber disposed on the second supporting plate;
    a second supporting unit opposite to the first supporting unit, the second supporting unit comprising:
        a second chamber;
        a third supporting plate having a first through opening for positioning the second chamber; and
        a plurality of second supporting bars, each of the plurality of the second supporting bars having a second groove depressed on an inner face of the second supporting bar in a longitudinal direction of the second supporting bar for positioning and strengthening the third supporting plate along a peripheral portion of the third supporting plate;
    a third supporting unit configured to apply pressure to the second chamber to level and fine position the second chamber, the third supporting unit comprising:
        a fourth supporting plate having a plurality of screws or movable parts that apply pressure to the second chamber; and
        a plurality of third supporting bars, each of the plurality of the third supporting bars having a third groove depressed on an inner face of the third supporting bar in a longitudinal direction of the third supporting bar for positioning and strengthening the fourth supporting plate along a peripheral portion of the fourth supporting plate; and
    a plurality of spacing posts disposed between the first supporting bars for positioning the first supporting plate and the second supporting bars for positioning the third supporting plate, each of the spacing posts connecting each of a corresponding first supporting bar, a corresponding second supporting bar and a corresponding third supporting bar,
    wherein the first chamber and the second chamber are configured such that when the first chamber is brought into contact with the second chamber, a micro processing chamber in which the semiconductor wafer is being processed is formed.

2. The semiconductor wafer cleaning apparatus of claim 1, wherein each of the first supporting bars is connected to a first end of a corresponding spacing post by welding or a first connecting means, wherein each of the second supporting bars is connected to a second end of the corresponding spacing post opposite to the first end by welding or a second connecting means, and wherein each of the third supporting bars is connected to a corresponding second supporting bar by welding or a third connecting means.

3. The semiconductor wafer cleaning apparatus of claim 2, wherein the first, the second, and the third connecting means are rods or screws.

4. The semiconductor wafer cleaning apparatus of claim 1, wherein the first supporting unit further comprises a first safety ring disposed on the first supporting plate, and wherein the movable unit further comprises a second safety ring disposed on the second supporting plate, the second safety ring being in contact with the first safety ring to form a cavity within which the driving unit is disposed.

5. The semiconductor wafer cleaning apparatus of claim 1, wherein the driving unit comprises one or more air bags, a mechanical positioner, or a pneumatic positioner.

6. The semiconductor wafer cleaning apparatus of claim 1, wherein the first supporting plate comprises one or more openings configured to receive the driving unit.

7. The semiconductor wafer cleaning apparatus of claim 6, wherein the one or more openings are further configured to receive a vacuum pump.

8. The semiconductor wafer cleaning apparatus of claim 1, wherein the movable unit further comprises a first box disposed on the second supporting plate within which the first chamber is disposed.

9. The semiconductor wafer cleaning apparatus of claim 8, wherein the first box has an inclined bottom surface, the inclined bottom surface configured to direct leaked fluids flowing to a lowest end of the first box.

10. The semiconductor wafer cleaning apparatus of claim 8, further comprising a leakage detector sensor disposed at a lowest end of the first box.

11. The semiconductor wafer cleaning apparatus of claim 8, wherein the first box comprises a drainage opening through which fluids leaked from the micro processing chamber are drained from the first box.

12. The semiconductor wafer cleaning apparatus of claim 1, wherein the second supporting unit further comprises a second box having a second through opening disposed on the third supporting plate, the second through opening being aligned with the first through opening such that the second chamber is disposed within the third supporting plate through the first and the second through openings.

13. The semiconductor wafer cleaning apparatus of claim 1, wherein each of the spacing posts further comprises a track for guiding a movement of the movable unit.

14. The semiconductor wafer cleaning apparatus of claim 1, wherein the movable unit further comprises a guiding means for guiding a movement of the movable unit.

15. The semiconductor wafer cleaning apparatus of claim 14, wherein the guiding means comprises a plurality of wheels, each of the plurality of wheels installed at a corner or an edge of the second supporting plate or at a corner or an edge of the first box.

16. The semiconductor wafer cleaning apparatus of claim 1, wherein each of the first supporting bars further comprises a fourth groove depressed on an end face of the first supporting bar, the fourth grooves configured such that a peripheral portion of a tool cover can be inserted and fixed into the fourth grooves.

17. The semiconductor wafer cleaning apparatus of claim 1, wherein at least one of the first chamber and the second chamber comprises one or more exhaust openings through which fluids are exhausted from the micro processing chamber.

18. The semiconductor wafer cleaning apparatus of claim 1, wherein at least one of the first chamber and the second chamber comprises one or more inlet openings through which fluids are introduced into the micro processing chamber.

19. The semiconductor wafer cleaning apparatus of claim 1, wherein the third supporting unit further comprises one or more pressure even plates for evening point pressures produced by the plurality of screws or movable parts on the fourth supporting plate.

20. The semiconductor wafer cleaning apparatus of claim 1, wherein the first supporting bars, the second supporting bars; and the third supporting bars comprise stainless steel or high strength aluminum alloy.

* * * * *